United States Patent [19]
Hass et al.

[11] Patent Number: 5,729,141
[45] Date of Patent: Mar. 17, 1998

[54] SPLIT GRADIENT COILS FOR MRI SYSTEM

[75] Inventors: Mathew Arnold Hass; Paul Domigan, both of Andover, Mass.

[73] Assignee: Intermagnetics General Corporation, Latham, N.Y.

[21] Appl. No.: 616,492

[22] Filed: Mar. 19, 1996

[51] Int. Cl.⁶ .................................................. G01V 3/00
[52] U.S. Cl. ................................... 324/318; 324/322
[58] Field of Search .................................. 324/318, 322, 324/314, 300, 307, 309; 128/653.5

[56] References Cited

U.S. PATENT DOCUMENTS

| | | | |
|---|---|---|---|
| 5,021,739 | 6/1991 | Yokosawa et al. | 324/248 |
| 5,256,972 | 10/1993 | Keren et al. | 324/318 |
| 5,365,172 | 11/1994 | Hrovat et al. | 324/309 |
| 5,386,191 | 1/1995 | McCarten et al. | 324/318 |
| 5,424,643 | 6/1995 | Morich et al. | 324/318 |
| 5,572,129 | 11/1996 | Carlson | 324/318 |
| 5,574,373 | 11/1996 | Pausch et al. | 324/318 |
| 5,585,724 | 12/1996 | Morich et al. | 324/318 |

OTHER PUBLICATIONS

Carlson et al, "Design and Evaluation of Shielded Gradient Coils", 1992, pp. 191–206.

*Primary Examiner*—Louis M. Arana
*Attorney, Agent, or Firm*—Helfgott & Karas, P C.

[57] ABSTRACT

In a magnetic resonance imaging system, wherein a subject to be imaged is supported within a bore of a magnet assembly and exposed to radio frequency (RF) energy emitted from an excitation coil, gradient coils and an RF screen are disposed within the region of the bore exteriorly to an excitation coil and are configured with a split or open region facing sections of the excitation coil for reduced image currents in the gradient coils and the RF screen from RF field generated by the excitation coil. The X gradient coil is reduced to two enlarged coil sections to the left and to the right of the bore. The two opposed sections of the X gradient coil, the two opposed sections of the Y gradient coil, and the opposed pairs of sections of the Z gradient coil are spaced apart at the top and the bottom of the bore for reduced interaction with the excitation coil section located at the top and the bottom of the bore. Thereby, the space between the excitation coil and the shield can be reduced. A more accurate image is developed with greater efficiency in terms of electric power.

8 Claims, 13 Drawing Sheets

SPLIT GRADIENT COILS FOR MRI SYSTEM

BACKGROUND OF THE INVENTION

This invention relates to gradient coils for encoding a magnetic field within the bore of an annular magnet assembly suitable for operation in a magnetic resonance imaging (MRI) system and, more particularly, to the provision of an arrangement of gradient coils having a split at the site of a radio-frequency (RF) field excitation coil of the MRI system for minimization of RF coupling between the excitation coil and the gradient coils.

One form of magnet assembly in general use in the construction of an MRI system employs a coil disposed in the bore of the magnet assembly for excitation of the RF field which, along with the magnetic field in the bore, interacts with a subject to obtain a nuclear magnetic resonance (NMR) signal employed for generating an image of the subject. A shield encircles the excitation coil to isolate the excitation coil from other coils, including gradient coils which are located outside of the shield for generating and encoding the magnetic field in the bore.

A problem arises in that the shield, while being effective to reduce coupling between the excitation coil and the gradient coils does so by attenuating the RF field produced by the excitation coil. This attenuation is greater when the excitation coil is closer to the shield. This requires that a space be provided between the shield and the RF excitation coil.

SUMMARY OF THE INVENTION

The aforementioned problem is overcome and other advantages are provided by a construction of a gradient coil with a configuration characterized by a split or open region between sections of the gradient coil wherein the split or open region breaks up the natural path that the currents in the shield would flow due to the RF field excitation coil in the bore region of an annular magnet assembly. This is of particular significance in the bore region of an MRI instrument. At the split, the configuration of the gradient coil is free of a wire or electrically conductive element which would serve to complete a closed path into which a current would be induced by the RF field. The reduction in RF coupling from excitation coil to gradient coil is sufficient so as to allow, in some applications, at least a partial removal of the shield, and/or a placing of the excitation coil against the shield or against the gradient coil, for a savings in space within the bore. The reduced coupling between the excitation and gradient coils allows the gradient coils to be positioned more closely to the excitation coil. This permits the magnet material which encloses the bore, as well as field control coils including the gradient coils, to be brought closer to the subject being imaged for more efficient use of the electric power applied to the MRI instrument. Also, a reduction of power consumption by the MRI instrument may be available while retaining a desired clarity of outputted image. Alternatively, the reduction in RF coupling from the excitation coil to the gradient coil can allow the bore to be made larger, while retaining the overall size of the magnet structure, for improved accessibility to a patient.

By way of example in the construction of the coil assembly, the excitation coil is in the form of a solenoidal RF excitation coil. The gradient coils are referred to as an X gradient coil, a Y gradient coil, and a Z gradient coil. The locations of the solenoidal excitation coil and the shield are arranged symmetrically about a longitudinal axis of the bore.

Typically, in the prior art, it has been the practice to construct the X coil as a set of four sections extending along the bore axis wherein the four sections lie outside of the excitation coil with the shield disposed between the excitation coil and the X gradient coil. Each section of the X gradient coil follows the cylindrical surface of the shield and of the bore. The four sections of the X gradient coil are disposed respectively above the subject, below the subject, to the right of the subject, and to the left of the subject. In each coil section, the portion of the section wherein the conductors extend in the axial bore direction are active in controlling the X component of the gradient.

In the invention, the X gradient coil is constructed of only two coil sections, one of the coil sections being at the right side of the bore and the other of the coil sections being at the left side of the bore. The same active control regions of current path are retained in the invention by enlarging the side sections X gradient coil and eliminating the top and the bottom sections of the X gradient coil. This creates the desired open region at the top and at the bottom of the X gradient coil of the invention for reduced interaction with the RF field. The two sections of the modified X gradient coil provide the same current sheets in the axial direction of the bore, while eliminating the presence of electrical conductors extending in transverse directions across the top and bottom portions of the bore, which transverse conductive paths are introduced in the prior art by the presence of top and bottom coil sections. The invention avoids the configuration of the closed electrically conductive path into which electric currents can be induced by the RF field.

It is noted also that, in the case of the prior-art arrangement of the gradient coils, that capacitive coupling may exist, by way of example, between a section of the X gradient coil, located at the top of the bore, and opposed sections of the Y or Z gradient coils. The construction of the invention also avoids this capacitive coupling of the prior art, which coupling also can serve as parts of a closed electrical path. By virtue of the reduced inductive and capacitive coupling provided by the invention, the gradient coils are substantially free of loading the excitation coil, and substantially free of any induced disturbance current component to the RF field. A more accurate image is developed with greater efficiency in terms of electric power.

With respect to the Y gradient coil, it is the practice in the prior art to construct this coil of two sections, one to the left of the subject and one to the right of the subject, the two sections lying outside of the shield and within the confines of the circular cylindrical surface of the bore. In the invention, the two sections are reconfigured to provide for an increased spacing between the two sections at the top and at the bottom of the bore so as to attain the desired open regions for reduced interaction with the RF field emanating from the top and the bottom sections of the excitation coil.

In the case of the Z gradient coil, it is the practice in the prior art to construct this coil of plural sections disposed sequentially in the axial direction and on both sides of the subject. In the invention, the coils are configured to have a greater spacing between the coil sections at the left side of the bore and the coil sections at the right side of the bore, the spacing being at both the top of the Z gradient coil and at the bottom of the Z gradient coil. This provides for the desired reduction in interaction with the RF field with the gradient coils.

In the gradient coil arrangement of the invention, connection between gradient coil sections of the right and left sides of the bore are made only at one end at the bottom of the bore, this arrangement of the interconnecting electrical conductors further reducing any induction of current from the RF field.

The above-described arrangement of the gradient coil also allows for an RF excitation coil to be made as a vertical saddle pair. The aforementioned splits in gradient coil structure break up the natural current path that the saddle excitation coil would generate. This design provides the same benefit for the saddle excitation coil as the solenoidal excitation coil.

BRIEF DESCRIPTION OF THE DRAWING

The aforementioned aspects and other features of the invention are explained in the following description, taken in connection with the accompanying drawing figures wherein:

FIGS. 9–12 show schematic views of coil sections disposed on one side of the bore, wherein FIG. 9 shows the X gradient coil, FIG. 10 shows the Y gradient coil, FIG. 11 shows the Z gradient coil, and FIG. 12 shows a bias (Bo) coil;

FIGS. 13–16 show interconnections and arrangements of a full set of each of the gradient coil assemblies wherein FIG. 13 shows the X gradient coil assembly, FIG. 14 shows the Y gradient coil assembly, FIG. 15 shows the Z gradient coil assembly, and FIG. 16 shows the bias (Bo) coil assembly.

Identically labeled elements appearing in different ones of the figures refer to the same element in the different figures but may not be referenced in the description for all figures.

DETAILED DESCRIPTION

Figure 1:
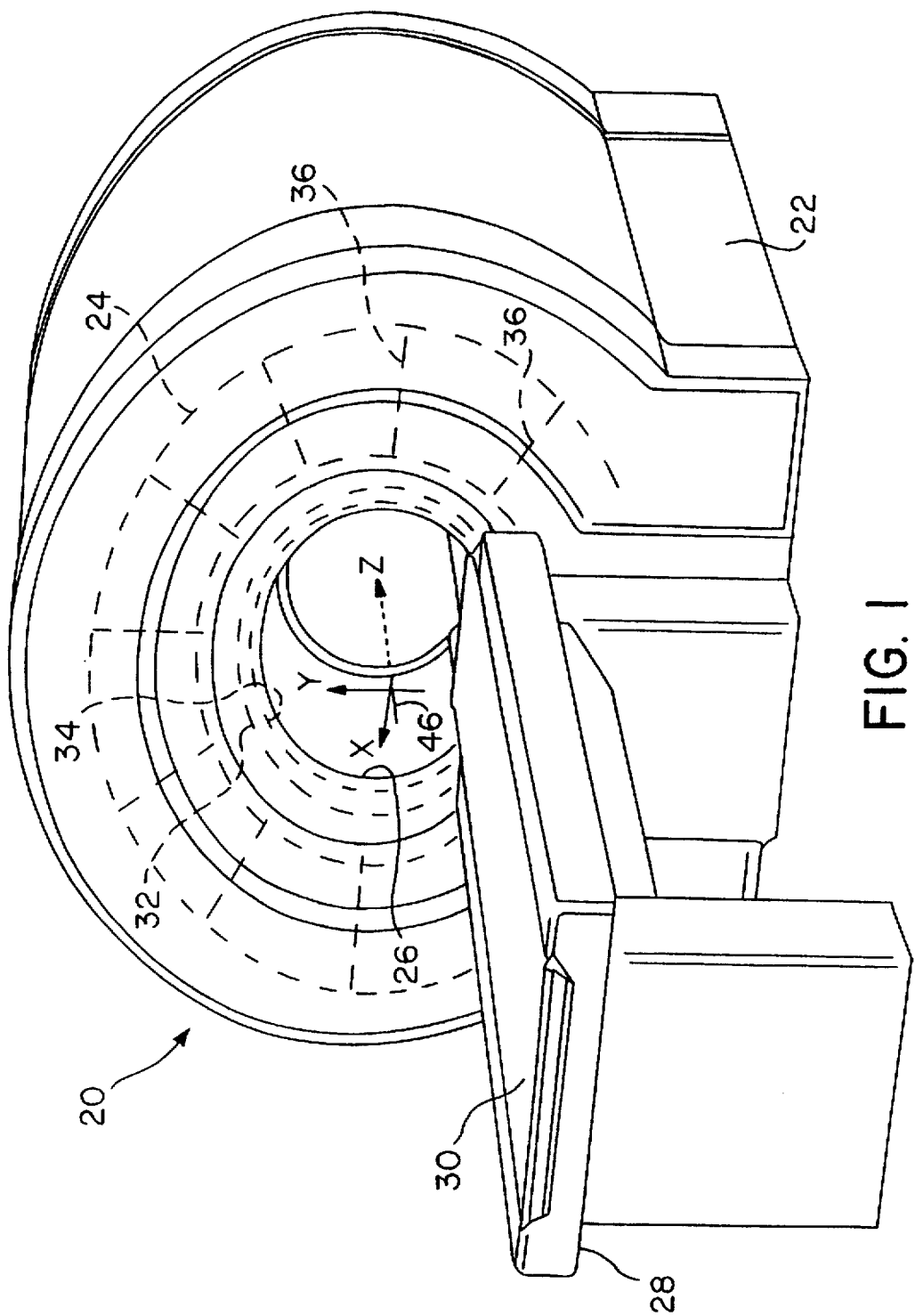
FIG. 1 is a stylized view of an MRI system including coils constructed in accordance with the invention.

FIG. 1 shows an MRI system 20 having a housing 22 which encloses a permanent magnet assembly 24 (indicated in phantom) disposed about a bore 26 for receiving a patient (not shown) which serves as a subject to be imaged by the system 20. Extending from the housing 22 is a table 28 having a movable platform 30 thereon for supporting the patient. Upon translation of the platform 30 into the bore 26, the patient is located in the bore whereupon the system 20 becomes operative for providing an image of subject matter within the patient. Also included within the bore region of the housing 22 are gradient coils 32, indicated in phantom, and an RF shield 34 of split configuration, (also indicated in phantom) which surrounds the bore 26. The invention is applicable to both circular and elliptically shaped bores and, by way of example, is disclosed herein with respect to an elliptically shaped bore because such a bore provides for a more efficient use of the space within the bore for the imaging of a human subject. The invention is applicable also to magnets of other geometries, such as superconducting magnets and shielded gradient coils. The permanent magnet assembly 24 is constructed of nonconductive elements so as to prevent formation of eddy currents and to avoid attenuation of gradient fields and RF fields. The permanent magnet assembly 24 may be constructed of 12 segments 36, each of which is fabricated of bricks of magnetic material as disclosed in copending patent application entitled "FULL BRICK CONSTRUCTION OF MAGNET ASSEMBLY HAVING A CENTRAL BORE" by Paul Domigan et al, Ser. No. 08/616,488, filed Mar. 19, 1996.

Figure 2:
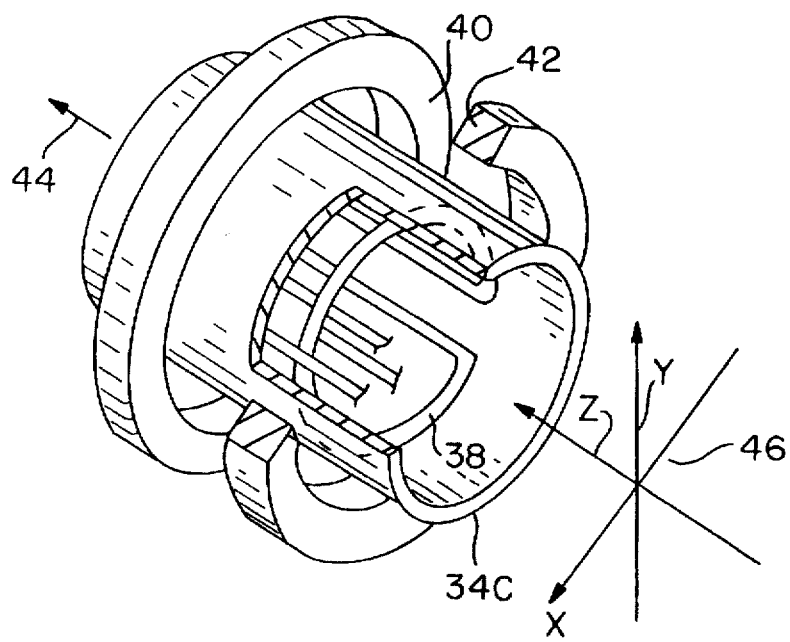
FIG. 2 is a stylized perspective view, according to the prior art, of a bore region of the system of FIG. 1, FIG. 2 showing a shield and a simplified view of coils in the region of the bore, a portion of an RF shield being cut away to disclose details of an excitation coil.
Figure 3:
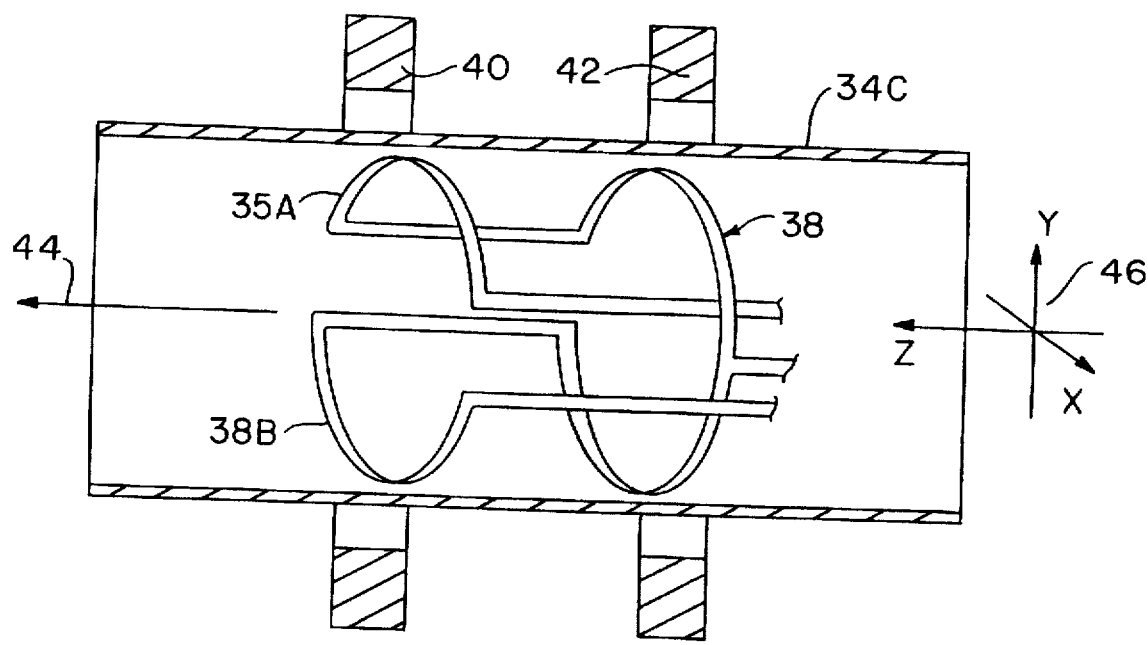
FIG. 3 is a stylized axial sectional view, according to the prior art, of the bore region showing the coils of FIG. 2.

With respect to the construction of the bore region, in accordance with the prior art as depicted in FIGS. 2 and 3, there is provided an RF field excitation coil 38 disposed within an encircling cylindrical RF shield 34C of the bore 26 (FIG. 1). The shield 34C of the prior art is not split as is the case with the shield 34 of the invention, described in FIG. 1 and to be described subsequently with reference to FIGS. 5–8. Disposed exteriorly of the RF shield 34C is a pair of Helmholtz coils 40 and 42 which generate a large, static, substantially homogeneous magnetic field 44 within the imaging space of the bore 26. The magnetic field 44 extends in a direction parallel to the cylindrical axis of the shield 34C and to the z axis of a Cartesian coordinate system 46. The excitation coil 38 is constructed as a saddle coil having an upper section 38A disposed at the top of the bore 26 and a lower section 38B disposed at a bottom of the bore 36. Other prior art systems employ a solenoidal excitation coil (not shown). In the coordinate system 46, the y axis is directed in a vertical direction of the bore 26 of FIG. 1, and the x axis is directed in a horizontal direction.

Figure 4:
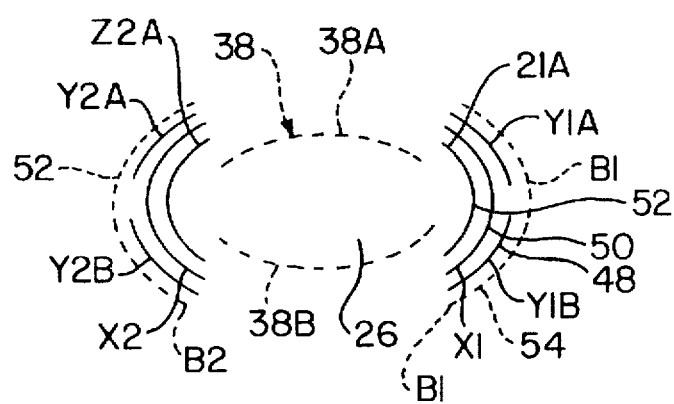
FIG. 4 is a diagrammatic end view of the bore region of the system of FIG. 1 for an alternative embodiment of the system of FIG. 1 wherein a shield as been eliminated, FIG. 4 showing locations of various coils which are energized in the operation of the system to produce an image of a subject.
Figure 5:
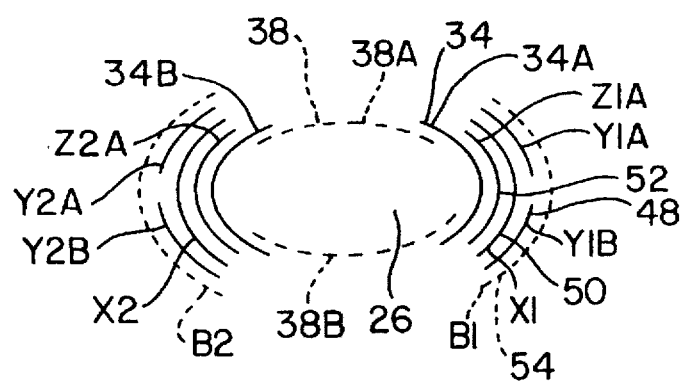
FIG. 5 is a view similar to that of FIG. 4 showing the preferred embodiment of the system of FIG. 1 employing a split shield having an elliptical cross section.
Figure 8:
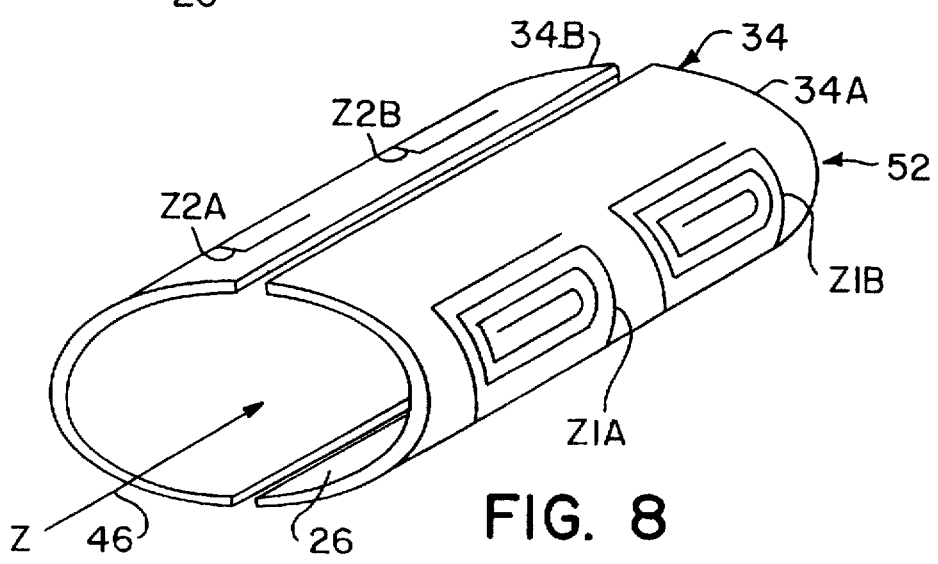

With reference to FIGS. 4–8, there are shown details in the construction of the various coil assemblies in accordance with the invention, these coil assemblies including a Y gradient coil 48 which is an assembly of four coil sections identified as Y1A, Y1B, Y2A, and Y2B (FIGS. 4, 5, and 6), an X gradient coil 50 which is an assembly of two coil sections X1 and X2 (FIGS. 4, 5, and 7), and a Z gradient coil 52 composed of an assembly of four coil sections, namely, coil sections Z1A and Z2A (FIGS. 4, 5, and 8) and coil sections Z1B and Z2B (FIG. 8). To facilitate the description, the gradient coils X, Y, and Z are shown as solid lines in FIGS. 4 and 5, while the excitation coil 38, and a bias coil 54 are shown in FIGS. 4 and 5 by dashed lines. Also, it is noted that the shield 34 (FIGS. 5–8) may have a circular cross-sectional shape, as generally employed in the prior art, or an elliptical cross-sectional shape as is employed in a preferred embodiment of the invention and shown in FIGS. 1 and 5–8. By virtue of the split configuration of the coils, adequate isolation between the excitation and the gradient coils can be obtained for some applications even without a shield as shown in FIG. 4.

The bias coil 54 of the invention, which operates in a manner similar to the Helmholz coils 40 and 42 of FIGS. 2 and 3 of the prior art, is located exteriorly of the shield 34 and is fabricated as an assembly of two coil sections B1 and B2 disposed respectively on the right and the left sides of the bore 26 (FIGS. 4–5). The coil sections B1 and B2 cooperate with the permanent magnet assembly 24 (FIG. 1) in establishing precisely a desired value of homogeneous magnetic field in the bore 26. The main magnetic field had a direction transverse to the axis of the bore 26. The major contribution to the magnetic field is made by the magnet assembly 24, and the coil 54 contributes a bias component to the magnetic field, the bias field being electrically adjustable to attain the required field strength for an accurate image of the subject. The current in the bias coil 54 may be altered also for adjustment of the field strength to compensate for temperature effects in the magnetic remanence of the permanent magnet assembly 24, thereby to compensate for a possible source of error and insure a high quality of the image.

As shown in FIG. 5, the Y gradient coil 48 is mounted outside of the shield 34, and the sections Y1A and Y1B are disposed on the right side of the bore 26 and to the exterior of the shield 34 with the section Y1A being above the section Y1B, and the sections Y2A and Y2B are located in the corresponding positions to the left side of the bore 26. The X gradient coil 50 and Z gradient coil 52 are mounted outside the shield 34. The X1 coil section is located to the right of the bore 26 and the X2 coil section is located to the left of the bore 26. The coil sections Z1A and Z1B are disposed serially in the direction of the Z axis on the right side of the bore 26, and the coil section Z2A and Z2B are disposed serially in the direction of the Z axis on the left side of the bore 26.

In accordance with the invention, it is recognized that there may be coupling of the RF signal from the excitation coil 38 to other ones of the coils, such as the gradient coils 48, 50 and 52 as well as to the bias coil 54. Such coupling can be reduced by increasing a spacing between the excitation coil 38 and the other coils, as well as by introduction of the continuous shield 34C (FIGS. 2–3) or the split shield 34 (FIGS. 5–8) between the excitation coil 38 and the gradient coils 48, 50, and 52 and also the bias coil 54. As noted hereinabove, the presence of the foregoing coupling requires that a space be maintained between the excitation coil and the bore shield so that the RF field is not attenuated in the bore. Generally, it is not feasible to greatly increase the spacing between the excitation coil and the other coils because of the consequent increase in the necessary space which must be energized with the magnetic field, and used by the subject.

Further, in accordance with the invention, the coupling is reduced by a rearranging of the electrical conductors of the gradient coils 48, 50, and 52 and of the bias coil 54 to produce a relative positioning of the coil conductor elements which reduces the RF coupling. In particular, this is accomplished by a splitting of the gradient coils 48, 50, and 52 and a splitting of the bias coil 54 as is shown in FIG. 5. The shield 34 introduces a significant reduction of the coupling and, by virtue of its split configuration, also reduces attenuation of the RF field produced by the excitation coil. In contrast, use of the shield 34C of the prior art would introduce significantly more attenuation of the RF field produced by the excitation coil. Less attenuation is obtained also by the splitting of the coils. As shown in FIGS. 4 and 5, the top and bottom sections 38A and 38B of the excitation coil occupy relatively little of the space at the right and the left sides of the bore 26. On the other hand, the gradient and the bias coils 48–54 are located primarily at the right and the left sides of the bore 26 while allowing for a major portion of each of the top and the bottom regions of the bore 26 to be free of the gradient and the bias coils 48–54. Thus, there is no complete path for image current in the gradient coil. The breaking up of the image current path reduces the attenuation of the RF field produced by the excitation coil. Thereby, in accordance with the invention, the MRI system 20 is able to provide images with higher accuracy and resolution than has been possible heretofore, with greater efficiency due to the decrease of the RF attenuation, and a larger patient bore.

Figure 9:
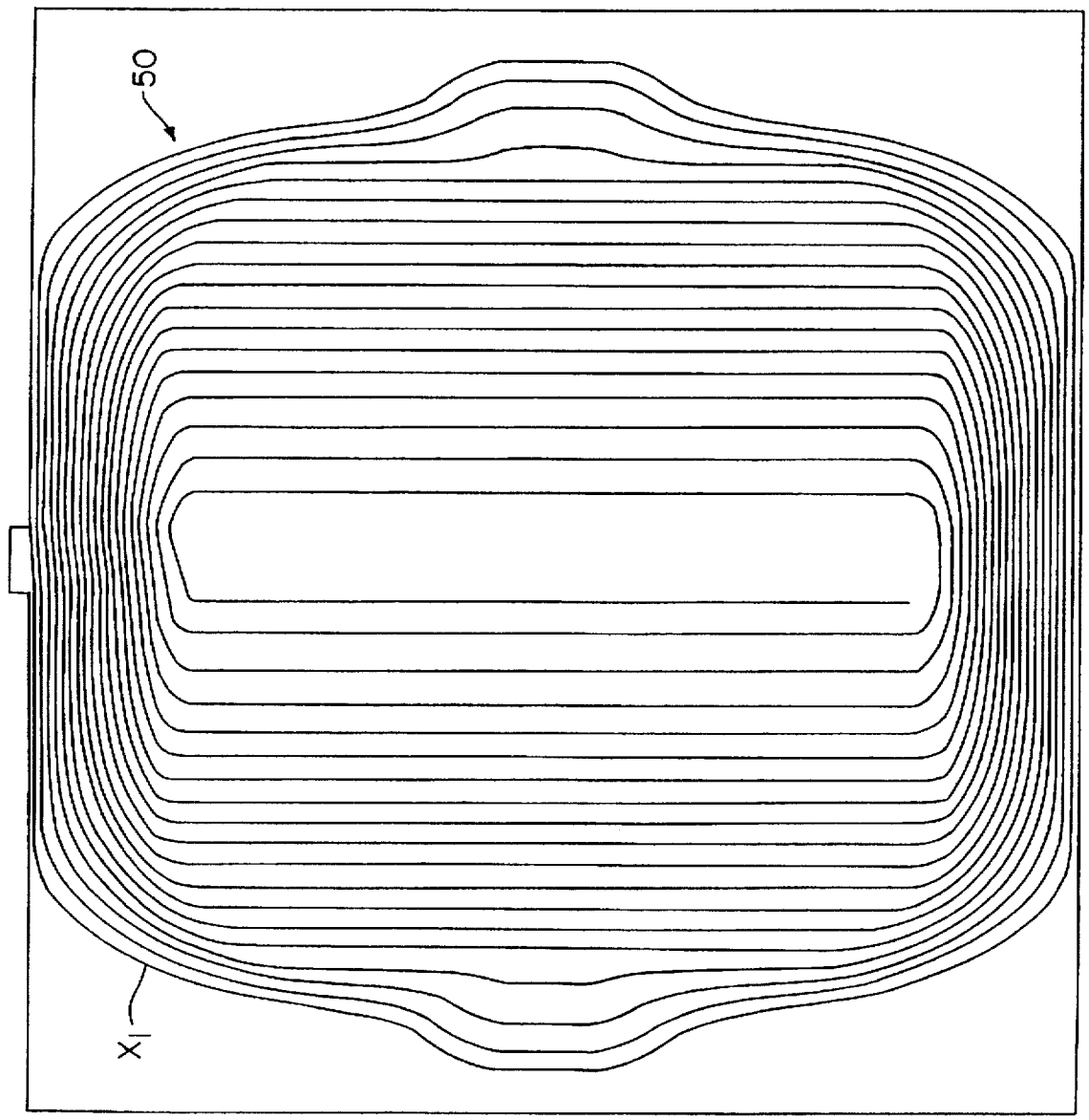

FIG. 9 shows construction of the X1 section of the X gradient coil 50, wherein a relatively large single coil extends a substantial length of the bore 26 (FIG. 1) in the direction of the Z axis. The two sections, X1 and X2 (FIGS. 4 and 5) are each formed by the wiring configuration shown in FIG. 9. The arrangement of the winding in FIG. 9 allows the various branches of the conductor to be located away from the central regions of the top and the bottom of the bore 26 while providing adequate control over the X dimension of the magnetic field gradient for encoding the magnetic field, thereby to identify the location of an image point from which an NMR signal emanates for the production of the resulting image.

Figure 6:
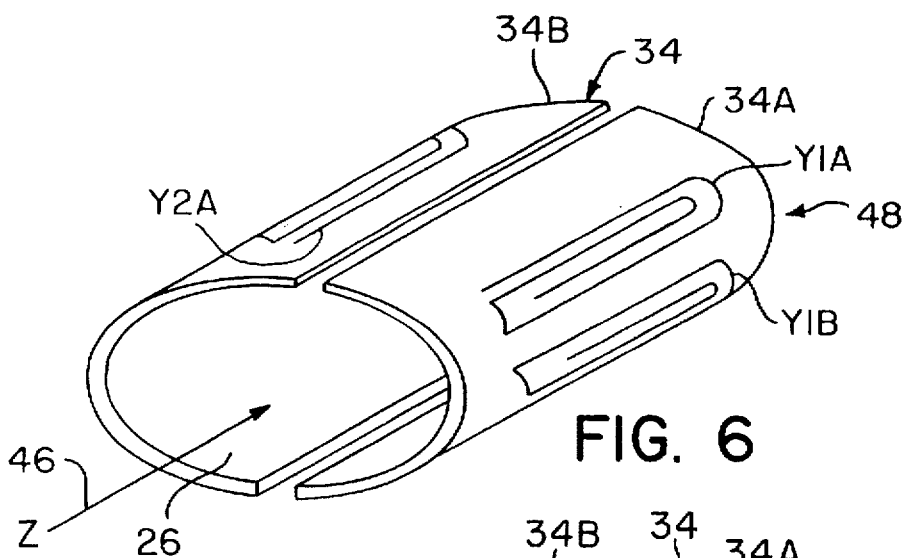
FIGS. 6–8 are diagrammatic views of gradient coils disposed about the shield of FIG. 4, wherein the Y gradient coil assembly is shown in FIG. 6, the X gradient coil assembly is shown in FIG. 7, and the Z gradient coil assembly is shown in FIG. 8.
Figure 7:
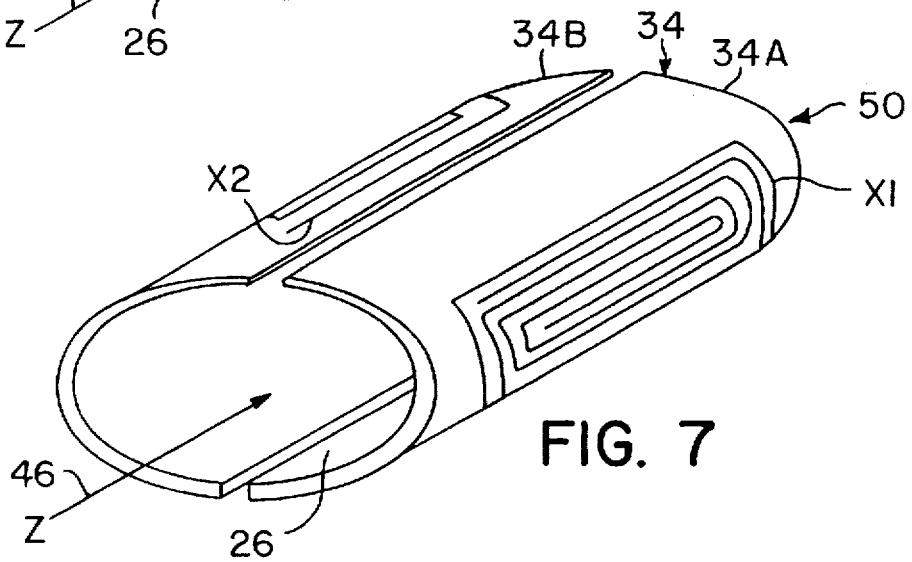
Figure 10:
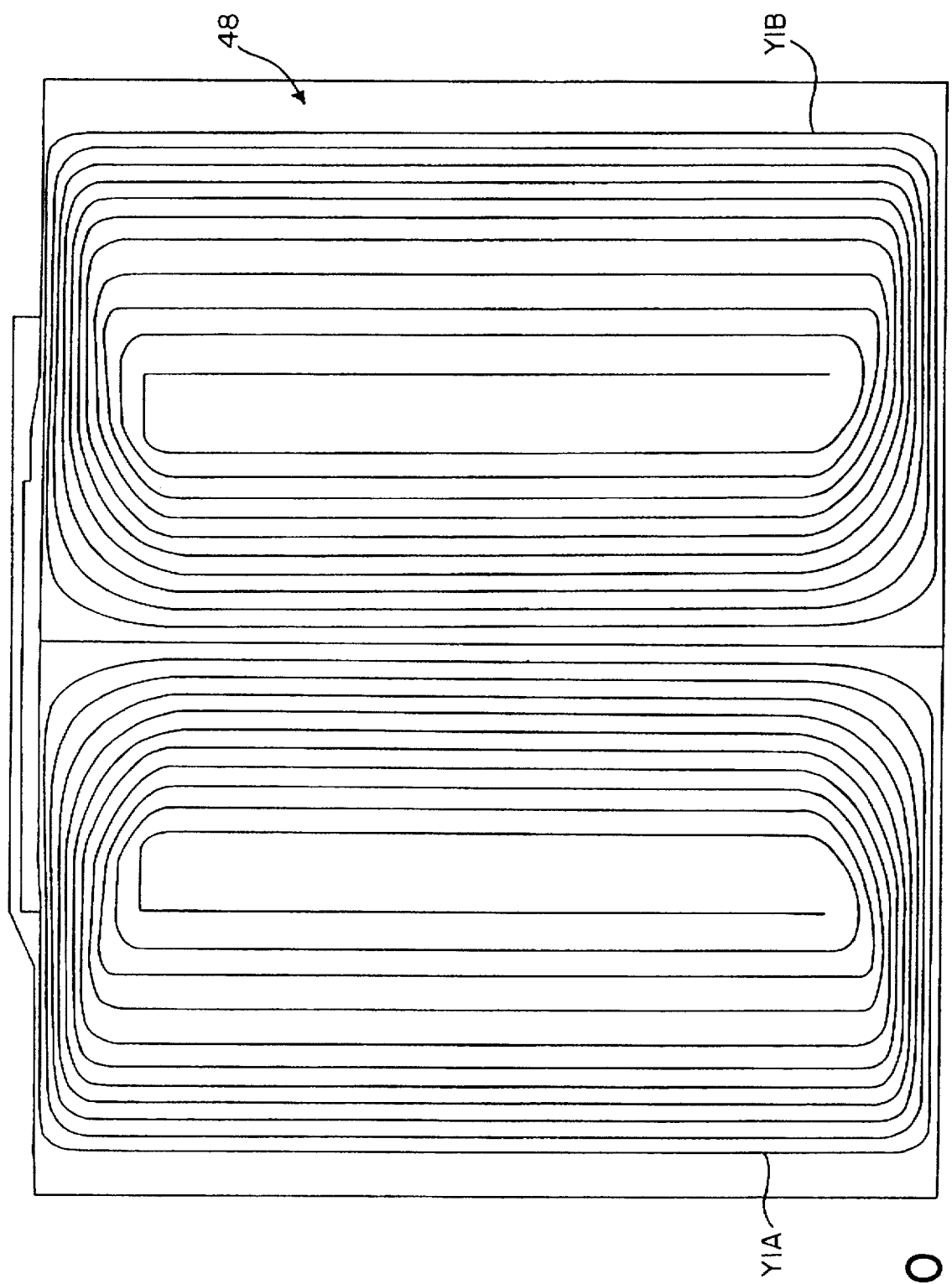

Similar comments apply to the description of the Y1A and Y1B sections of the Y gradient coil 48 of FIG. 10 wherein the various conducting branches of the coil are withdrawn from the central regions at the top and the bottom of the bore 26 (FIGS. 4–6). As shown in FIG. 10, the Y1A and Y1B sections of the coil extend the length of the bore 26 along the Z axis with the section Y1A being above the section Y1B. This arrangement of the coil sections Y1A and Y1B enable generation of the Y component of the gradient magnetic field for suitably encoding the field as required to identify the location of the source of an NMR signal.

Figure 11:
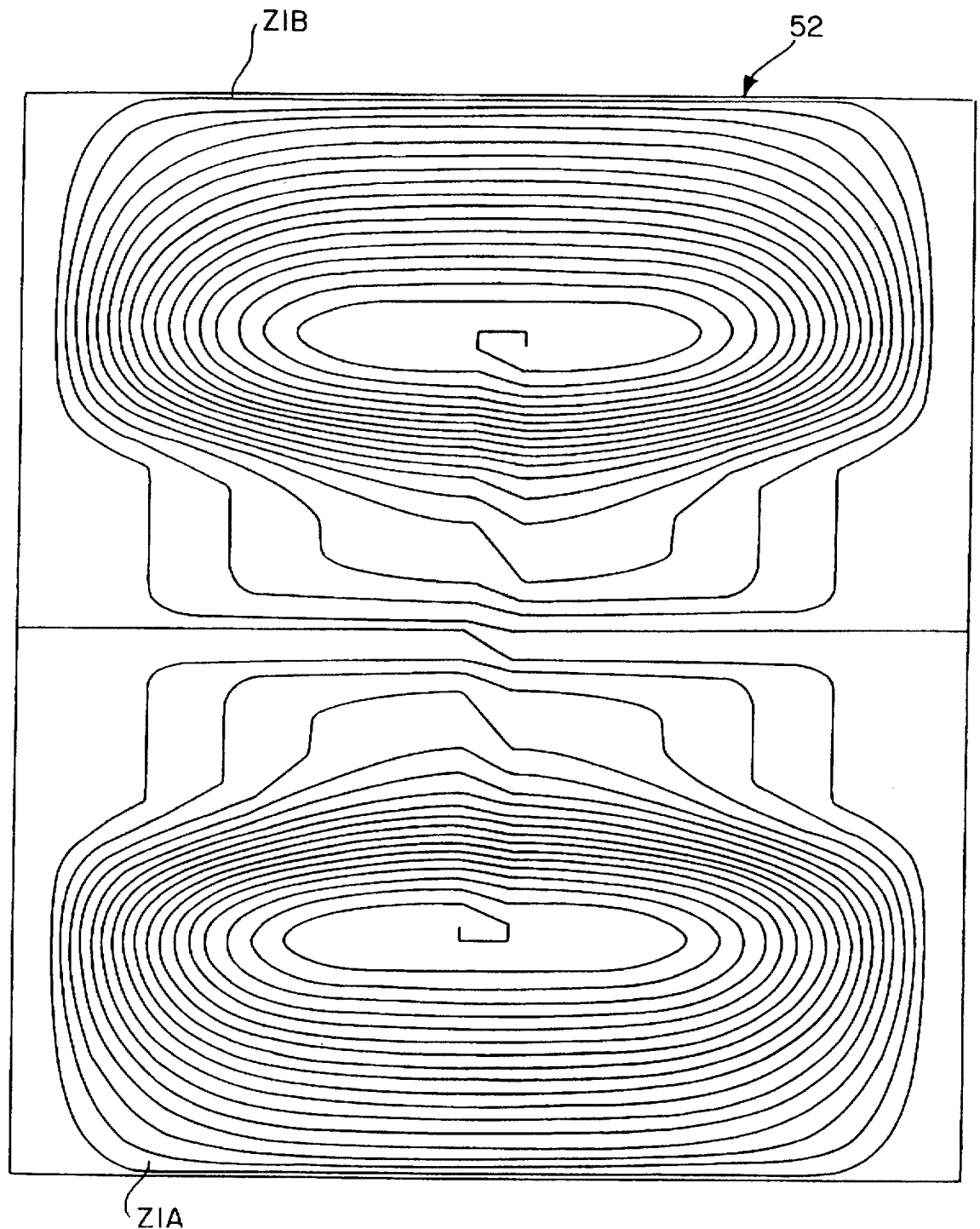

FIG. 11 shows construction of the Z gradient coil 52, the figure showing the coil sections Z1A and Z1B disposed serially in the Z direction along the length dimension of the bore 26 (FIGS. 1, 4–5 and 8) on the right side of the bore 26. The conductive elements of the coil sections are withdrawn from the central portions at the top and the bottom of the bore 26 for reduced interaction with the excitation coil 38 while providing adequate control of the Z component of the magnetic field gradient for suitably encoding the magnetic field. The foregoing construction of the coil sections Z1A and Z1B, as shown in FIG. 11, are employed also in the construction of the corresponding coil sections Z2A and Z2B on the left side of the bore 26.

Figure 12:
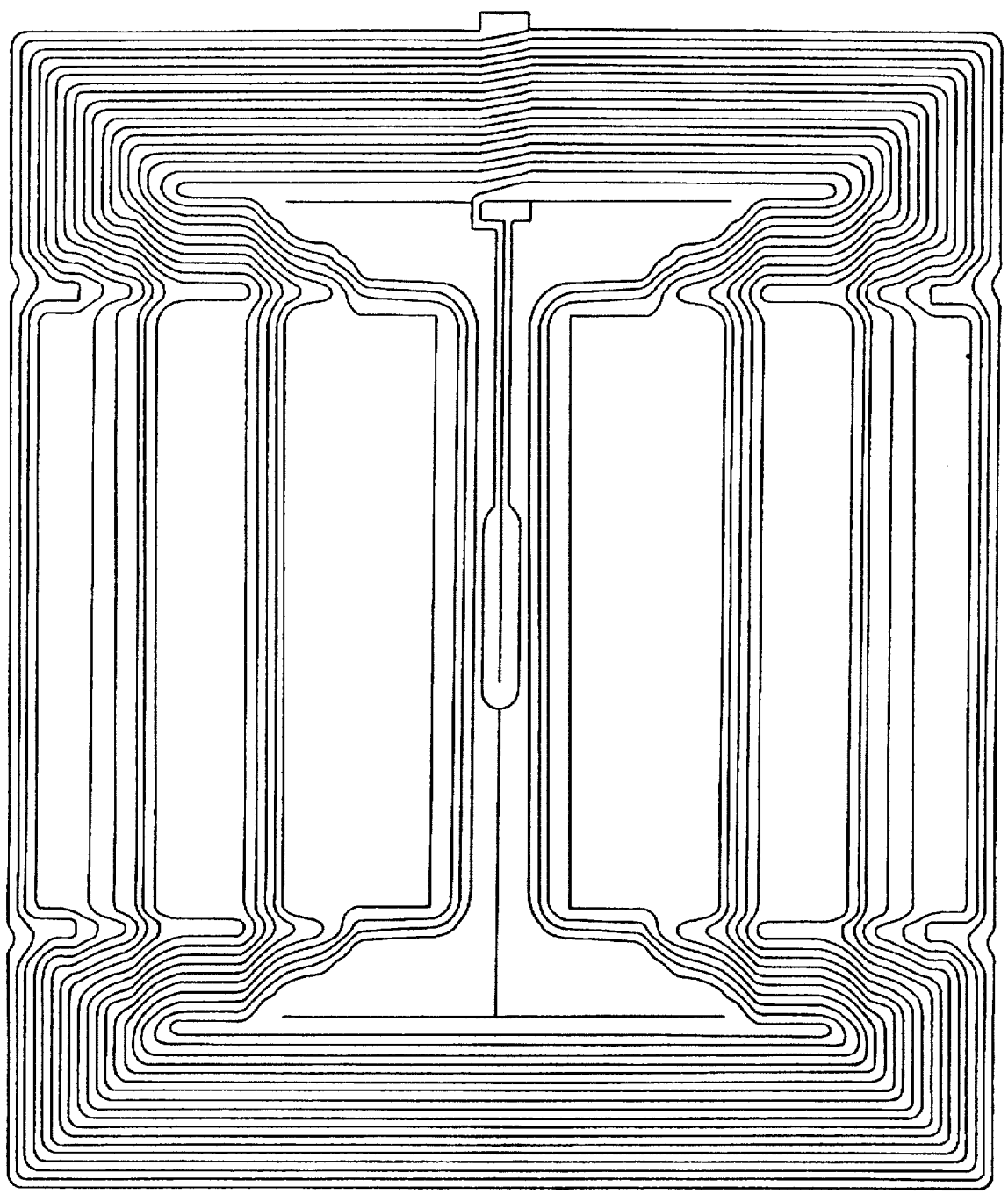

In FIG. 12, there is shown one section B1 of the bias (Bo) coil 54 disposed on the right side of the bore 26 (FIGS. 4–5). The section B2 of the bias coil 54 for the left side of the bore 26 is constructed in similar fashion to the section B1 as portrayed in FIG. 12. The two sections B1 and B2 extend the length of the bore 26 along the z axis (FIG. 1). The conductive elements of the coil 54 at the top and bottom portions of the coil 54 have been withdrawn from the central regions at the top and the bottom of the bore 26 for reduced interaction with the excitation coil 38. As shown in FIG. 12, there is a concentration of conductive elements extending in the transverse direction of the bore 26 at both the front and the back regions of the bore 26 while, in the case of the conductive elements of the coil extending parallel to the Z axis, these elements are spaced apart in the transverse dimension of the bore 26. This arrangement of the conductive elements of the bias coil 54 enables the current in the various conductive elements of the coil to produce the desired bias magnetic field with the desired degree of homogeneity.

The foregoing description of the gradient and the bias coils 48–54 apply to both the embodiment of the invention shown in FIG. 4 wherein there is an absence of shield in the bore 26, and to the embodiment of the shield 34 in FIG. 5 wherein, in accordance with a preferred embodiment of the invention, the shield 34 is split into a right section 34A and a left section 34B. The two sections 34A and 34B lie within the regions of overlap of the excitation coil 38 with the gradient and the bias coils 48–54 as well as within the regions occupied by the gradient and the bias coils 48 and 54 about the periphery of the bore 26. However, in the central portions of the top and the bottom of the bore 26, wherein there are no conductive elements of the gradient and the bias coils 48–54, the construction of the shield 34 has been simplified by omission of shielding material at the top and the bottom portions of the bore It is noted that interconnection of one coil section with another coil section in any one of the coils 48–54, whether the two coil sections be on side of the bore 26 or on opposite sides of the bore 26, requires no more than a single electrically conductive wire or element. Connection between coil sections on opposite sides of the bore 26 can readily be accomplished by use of a single conductive wire located at the bottom of the bore 26. This eliminates the presence of an electrically conductive path at the top of the bore 26. Furthermore, even in the connection of the coil sections by a wire at the bottom of the bore, such connection by the single wire is distinguishable from the multitude of wires extending between opposite sides of the bore 26 in prior-art configurations of coil windings.

As a result of the invention, in both the embodiments of FIGS. 4 and 5, there is reduced RF coupling, as noted hereinabove, between the excitation coil and the other coils, namely the gradient and the bias coils 48–54. Such reduction in coupling reduces the need for the relatively large spacing of 4–5 centimeters to a substantially smaller spacing of 0.5 centimeters between the excitation coil and the shield. In addition, the reduced coupling permits a closer spacing of the gradient coils to the subject within the bore 26, thereby reducing the overall volume of imaging region that must be energized with magnetic fields. This results in a more efficient use of electric power in operating the MRI system 20 of FIG. 1. Alternatively, if desired, the original overall dimensions of the magnet structure may be maintained and the available space in the bore for a patient may be increased.

Conceptually, by reducing the extent of the excitation coil in the crosswise or x dimension of the bore 26, there is still less chance of interaction between the excitation coils and the gradient coils. With such a configuration, adequate accuracy of an image may be produced by the system 20 even in the total absence of the RF shield. This permits an even closer spacing of the gradient coils. In addition, the elimination of the shield, as shown in FIG. 4, also eliminates a source of eddy currents which are induced in the shields. This provides for improved accuracy in the generation of the image. With respect to such eddy currents, it is noted also that the split configuration of the shield 34 of FIG. 5 provides for reduced generation of such eddy currents, as compared to the continuous configuration of the prior-art shield 34C disclosed in FIGS. 2 and 3. It is noted also that the coil configurations of FIGS. 9–12 are intended for use with the elliptic configuration of the bore 26, and that a similar configuration of coils is readily adapted for use with a bore having less ellipticity and even a bore of circular cross-section. It should be noted also that the aforementioned concepts can be applied to shielded gradient coil sets used in superconducting MRI systems.

Figure 13:
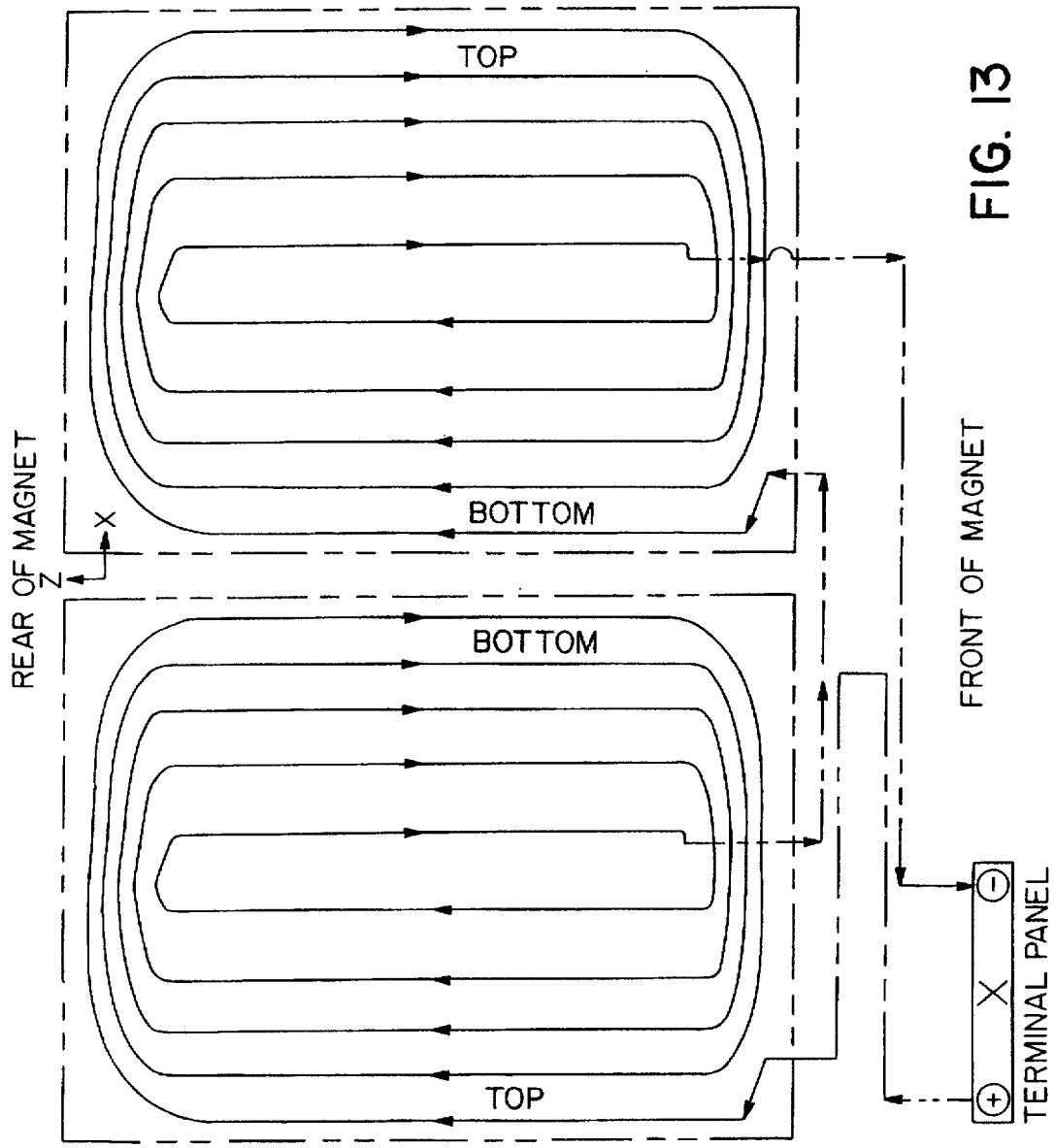

With reference to FIGS. 13 and 9, FIG. 13 shows interconnection of two sections of the X gradient coil assembly wherein each section is constructed as shown in FIG. 9, and wherein the two sections are disposed on opposite sides of the bore, and extend from a bottom region of the bore to a top region of the bore while being spaced apart from each other at the top and the bottom of the bore as has been described hereinabove. The two sections extend in the axial direction of the bore from the front of the magnet assembly to the rear of the magnet assembly. In the coordinate system shown in FIG. 13, the Z direction is along the bore axis, and the X direction is circumferential around the bore.

Figure 14:
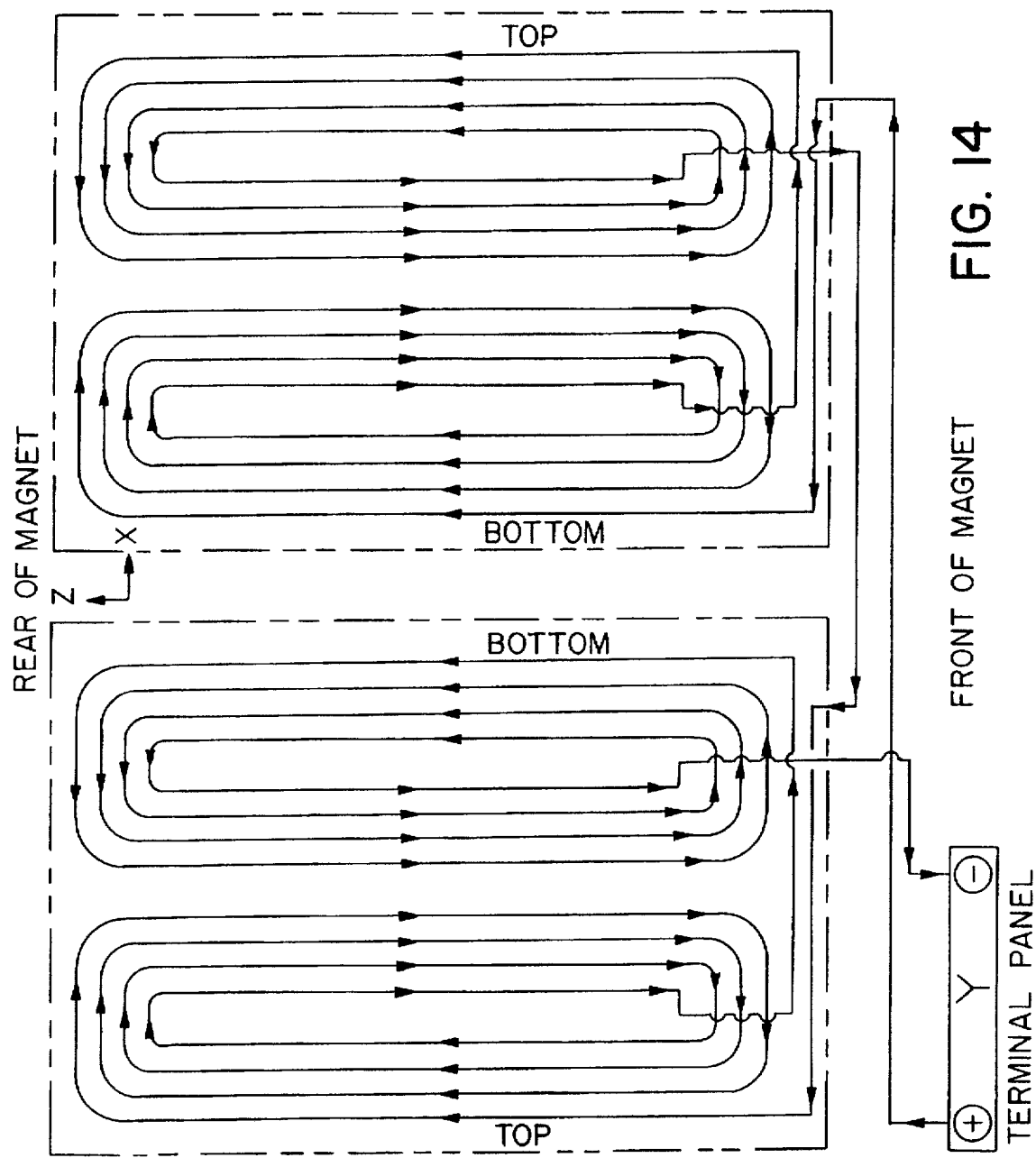

With reference to FIGS. 14 and 10, FIG. 14 shows interconnection of four sections of the Y gradient coil assembly wherein two sections are constructed as shown in FIG. 10, and wherein the two sections of FIG. 10 are disposed on one side of the bore and the remaining two sections are disposed on the opposite side of the bore. The two sections of the Y coil gradient assembly on the one side of the bore extend from a bottom region of the bore to a top region of the bore. The two sections of the Y coil gradient assembly on the opposite side of the bore extend from the bottom region of the bore to the top region of the bore. The coil sections are spaced apart from each other at the top and the bottom of the bore as has been described hereinabove. The four sections extend in the axial direction of the bore from the front of the magnet assembly to the rear of the magnet assembly. In the coordinate system shown in FIG. 13, the Z direction is along the bore axis, and the X direction is circumferential around the bore.

Figure 15:
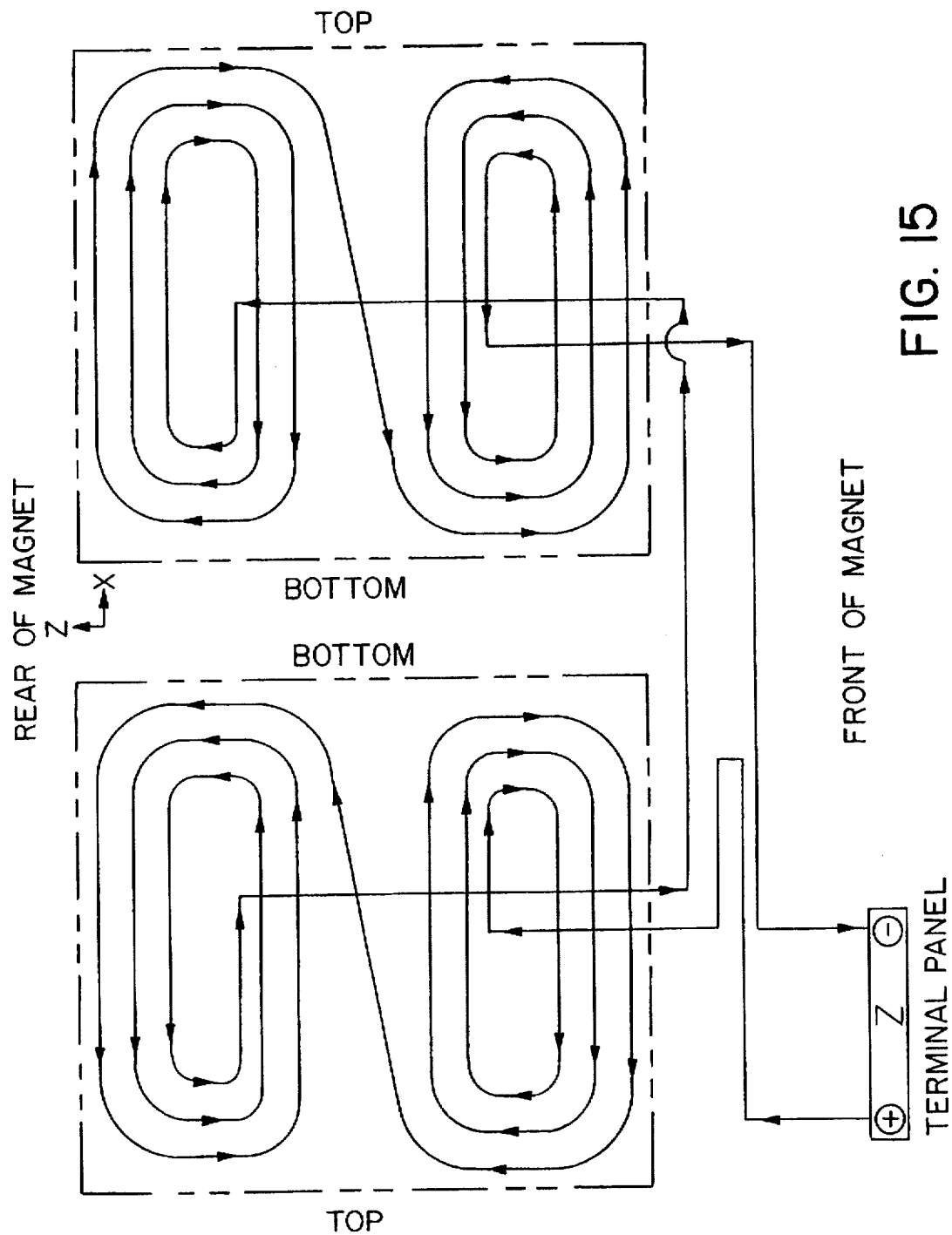

With reference to FIGS. 15 and 11, FIG. 15 shows interconnection of four sections of the Z gradient coil assembly wherein two sections are constructed as shown in FIG. 11, and wherein the two sections of FIG. 11 are disposed on one side of the bore and the remaining two sections are disposed on the opposite side of the bore. The two sections of the Z coil gradient assembly on the one side of the bore extend from a bottom region of the bore to a top region of the bore. The two sections of the Z coil gradient assembly on the opposite side of the bore extend from the bottom region of the bore to the top region of the bore. The coil sections are spaced apart from each other at the top and the bottom of the bore as has been described hereinabove. The two sections on each side of the bore are located serially in the axial direction of the bore from the front of the magnet assembly to the rear of the magnet assembly. In the coordinate system shown in FIG. 13, the Z direction is along the bore axis, and the X direction is circumferential around the bore.

Figure 16:
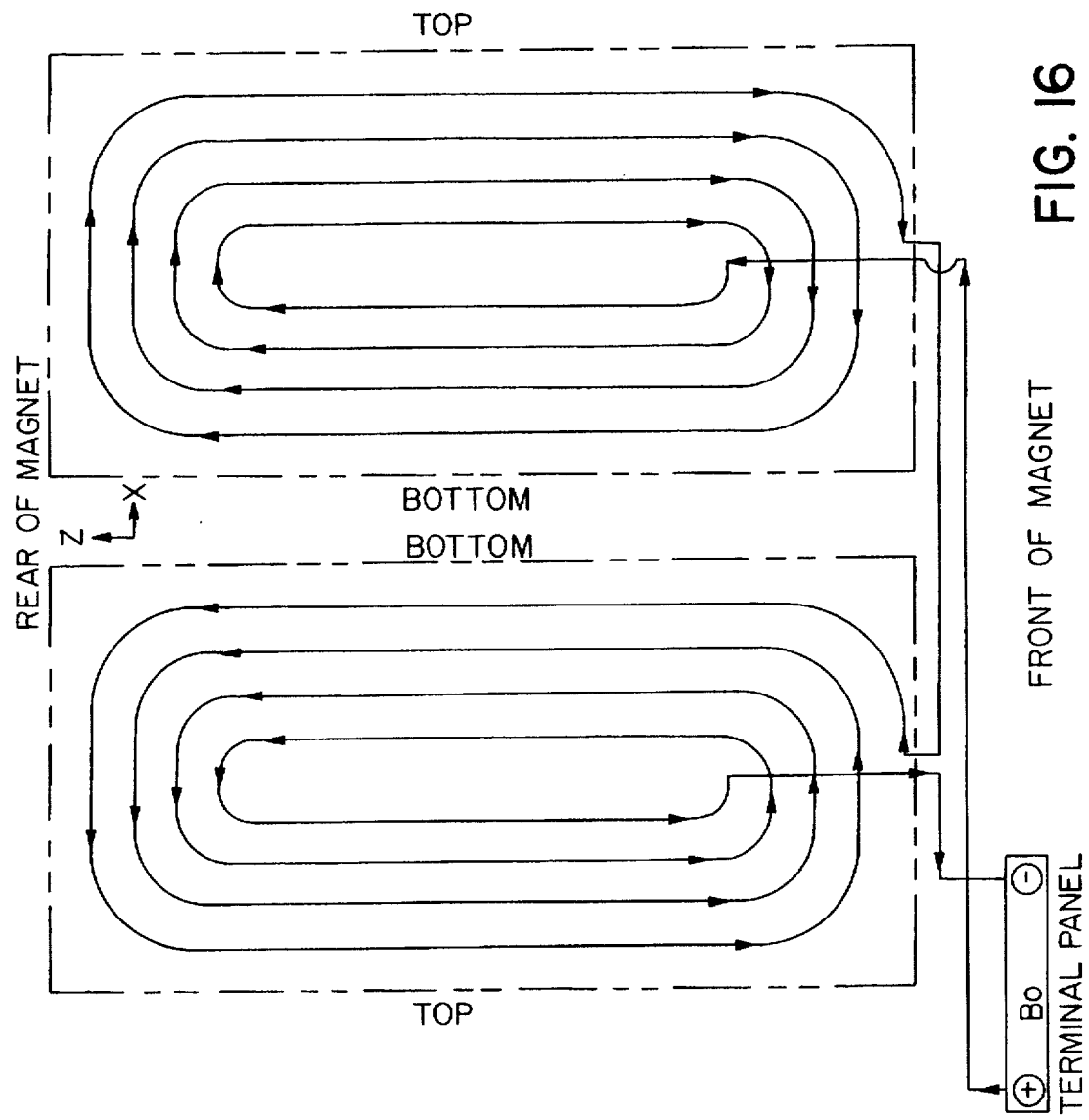

With reference to FIGS. 16 and 12, FIG. 16 shows interconnection of two sections of the Bo bias coil assembly wherein each section is constructed as shown in FIG. 12, and wherein the two sections are disposed on opposite sides of the bore, and extend from a bottom region of the bore to a top region of the bore while being spaced apart from each other at the top and the bottom of the bore as has been described hereinabove. The two sections extend in the axial direction of the bore from the front of the magnet assembly to the rear of the magnet assembly. In the coordinate system shown in FIG. 16, the Z direction is along the bore axis, and the X direction is circumferential around the bore.

Figure 17:
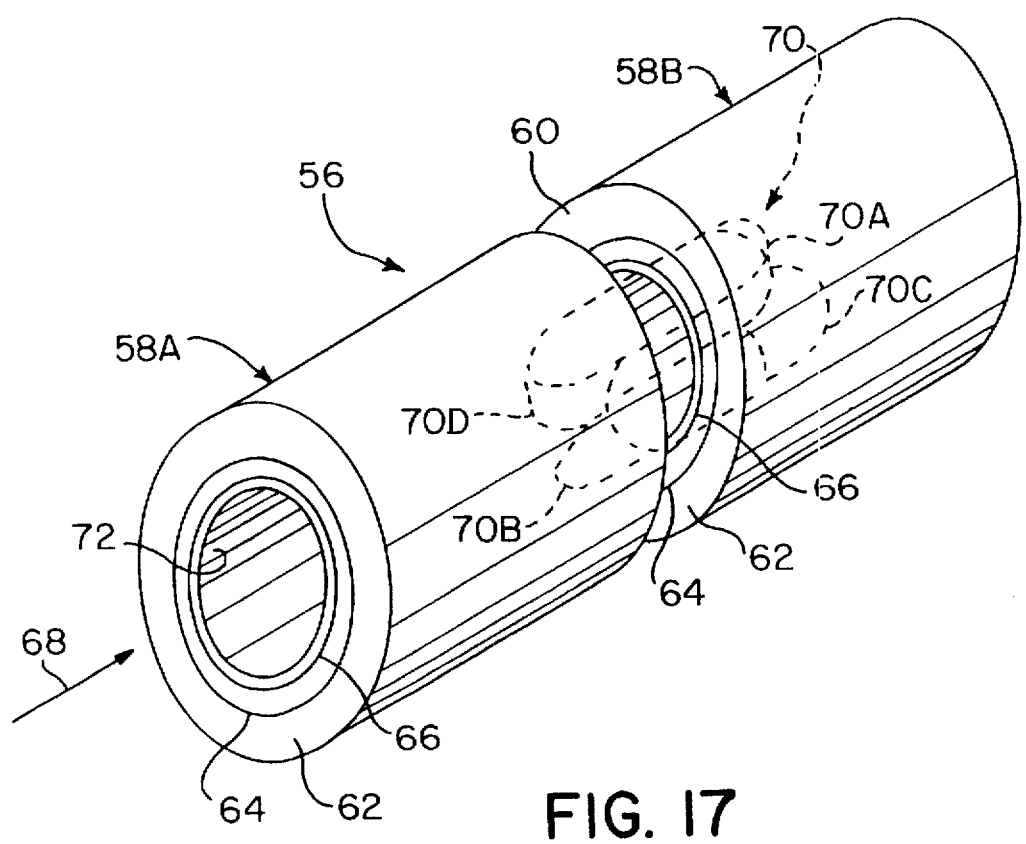
FIG. 17 is a stylized view of a coil assembly constructed in accordance with an alternative embodiment of the invention.

FIG. 17 shows an alternative configuration of coil assembly 56 suitable for use with a superconducting magnet, the coil assembly 56 including a spitting of coils and shield in accordance with the inventive concept described above. The coil assembly 56 is split into two sections 58A and 58B which are separated by a gap 60. The coil section 58A comprises a section 62 of shield coils, a section 64 of generating coils, and a section 66 of shield. The coil section 58B has the same construction as the coil section 58A. The direction of the main magnetic field is along an axis of the assembly 56 as is indicated by an arrow 68. A set 70 of excitation coils (indicated in phantom) is located at the gap 60, and extends on both sides of the gap 60 within bores 72 of the shield sections 66. The set 70 has four excitation coils 70A–D which are located respectively at the top, the bottom, the right side, and the left side of the coil assembly 56. In the coil assembly 56, the shield coil section 62 and the generating coil section 64 each contain three coils comprising X, Y and Z gradient coils of different configuration than the configuration of the gradient coils described hereinabove to accommodate the different direction of main magnetic field.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A MRI system for exposing a subject to both magnetic and RF fields, comprising:

a magnetic assembly having a bore with a longitudinal axis for receiving the subject, the magnet assembly producing a magnetic field within the bore;

a RF shield within said bore said shield having a split;

an excitation coil between said axis and said RF shield for exciting an RF field within the bore; and a set of gradient coils, said set including individual ones of coils in separate coil sections, clearance spaces being provided between said sections in said gradient coil set, image currents of said shield and said gradient coils being inhibited by said split and said clearance spaces, said image currents being caused by said RF field.

2. A system according to claim 1 wherein, with respect to any one of said gradient coils of said gradient coil set, a gradient coil is disposed concentric to said excitation coil and has a first section with electrical conductors extending in the axial direction of the bore on a first side of the bore, and has a second section with electrical conductors extending in the axial direction of the bore on a second side of the bore opposite said first side, said electrical conductors of the first section being electrically isolated from the electrical conductors of the second section across the clearance space, there being a clearance space at the top and at the bottom of the bore between conductors of said first section and conductors of said second section, interaction between said gradient coil and said excitation coil being reduced.

3. A system according to claim 1 further comprising a Y gradient coil disposed concentric to said excitation coil and having a first part with electrical conductors extending in the axial direction of the bore on the first side of the bore, and having a second part with electrical conductors extending in the axial direction of the bore on the second side of the bore opposite said first side, said electrical conductors of the first and the second parts of said Y gradient coil being electrically isolated from each other across the top of the bore, said first and said second parts of said Y gradient coil being spaced apart by said clearance spaces; and a Z gradient coil having a first set of plural sections of electrical conductors disposed in the axial direction of the bore along the first side of the bore, and having a second set of plural sections of electrical conductors disposed in the axial direction of the bore along the second side of the bore, said electrical conductors of the first and the second sets of said Z gradient coil being electrically isolated from each other across the top of the bore, and said first and said second sets being spaced apart by said clearance spaces at the top and the bottom of the bore.

4. A system according to claim 1 wherein said magnet assembly includes a magnet of electrically nonconductive structure encircling said bore.

5. A MRI system as in claim 1, wherein said split and at least one of said clearance spaces are aligned to each other.

6. A MRI system as in claim 5, wherein said split is aligned with each of said clearance spaces.

7. A MRI system as in claim 5, wherein said split and said at least one clearance space are aligned circumferentially.

8. A MRI system as in claim 1, wherein said excitation coil and said shield are radially spaced approximately 0.5 centimeters apart in said bore, said bore being sized to receive a human patient as said subject.

* * * * *